United States Patent [19]
Arndt et al.

[11] 3,967,982
[45] July 6, 1976

[54] METHOD OF DOPING A SEMICONDUCTOR LAYER

[75] Inventors: Heinz-Herbert Arndt, Taufkirchen; Joachim Burtscher, Munich; Gustav Fischer, Nurnberg; Ernst Haas, Erlangen; Joachim Martin, Erlangen; Gunter Raab, Erlangen; Manfred Schnoeller, Haimhausen, all of Germany

[73] Assignee: Siemens Aktiengesellschaft, Berlin & Munich, Germany

[22] Filed: July 11, 1975

[21] Appl. No.: 595,150

[30] Foreign Application Priority Data
July 15, 1974  Germany............................ 2433991

[52] U.S. Cl................................. 148/1.5; 148/187; 357/91
[51] Int. Cl.²......................................... H01L 21/263
[58] Field of Search ................ 148/1.5, 187; 357/91

[56] References Cited
UNITED STATES PATENTS
3,733,222   5/1973   Schiller................................ 148/1.5

FOREIGN PATENTS OR APPLICATIONS
886,232   1/1962   United Kingdom.................. 148/1.5

OTHER PUBLICATIONS
Davis et al., "Nucleon Bombarded Germanium Semiconductors, II," AECD–2054, Tech. Inf. Div., Oak Ridge Oper. AEC, 11/15/48.

Primary Examiner—L. Dewayne Rutledge
Assistant Examiner—J. M. Davis
Attorney, Agent, or Firm—Hill, Gross, Simpson, Van Santen, Steadman, Chiara & Simpson

[57] ABSTRACT

A semiconductor layer, such as an epitaxial layer on a suitable substrate is subjected to controlled bombardment by neutrons whereby the atoms of the semiconductor layer are converted via nuclear reaction into doping material atoms.

16 Claims, 2 Drawing Figures

METHOD OF DOPING A SEMICONDUCTOR LAYER

BACKGROUND OF THE INVENTION

1. Field of the Invention

The invention relates to methods of doping a semiconductor layer on a substrate.

2. Prior Art

A variety of methods for doping a semiconductor element with a doping material are known. In one such method, a dopant is diffused into the semiconductor element from a gaseous phase by the use of a heat treatment. For example, a mixture of a gaseous dopant or a gaseous compound which yields the desired dopant, a carrier gas, such as a rare gas and a suitable gaseous semiconductor compound, such as silane, are brought into contact with a heated substrate so that a doped semiconductor layer is pyrolytically deposited on the substrate. In another known method for doping a semiconductor element, an insulating layer such as a $SiO_2$-layer having a dopant substance therein is applied onto a semiconductor element which is to be doped. During the subsequent heat treatment of such an arrangement, the dopant atoms diffuse from the insulating layer into the semiconductor layer so as to form a doped semiconductor layer. In yet another known doping method, suitable dopant ions are introduced into a semiconductor element via an applied electrical field, i.e. by ion implantation.

All of such known methods have certain advantages and depending on the type of doping required, one such method may be chosen to provide the desired results. However, the ever-increasing requirement for semiconductor components, particularly composed of silicon, require an improved method for doping wherein an extremely uniform dopant distribution in the semiconductor element can be simply and reliably achieved.

SUMMARY OF THE INVENTION

The invention provides a method of doping a semiconductor element whereby an extremely uniform dopant distribution within a semiconductor layer is achieved.

In accordance with the principles of the invention, a semiconductor layer on a suitable substrate is subjected to controlled neutron bombardment so that at least some of the semiconductor material atoms are converted via known nuclear reactions into dopant material atoms.

The invention is useful for uniformly doping an epitaxial layer of silicon or an $A_{III}B_V$ compound deposited on a suitable substrate, for example, one comprised of a silicon base, an $A_{III}B_V$ compound, a sapphire, a spinel, etc., by subjecting such layer to controlled neutron bombardment. In certain embodiments of the invention a suitable masking layer having at least one window therein may be applied onto the semiconductor layer to be doped so as to produce localized doping within the layer.

DESCRIPTION OF THE PREFERRED EMBODIMENTS

The invention provides a method of reliably, simply and extremely uniformly doping a semiconductor layer.

In accordance with the principles of the invention, a semiconductor layer, such as composed of silicon or an $A_{III}B_V$ compound is subjected to controlled neutron bombardment so that atoms of the semiconductor layer are converted by known nuclear reactions into dopant material atoms.

Neutrons have virtually unlimited penetration power in semiconductor materials so that, assuming a uniform neutron stream or flux (which is readily achieved via conventional neutron technology), uniform doping of a semiconductor layer on a substrate subjected to such a uniform neutron flux is readily, simply and reproducibly achieved. Thus, by using the principles of the invention, one may achieve a uniform and precisely adjustable dopant concentration within a semiconductor layer.

In one embodiment of the invention, a silicon layer is doped with phosphorus in accordance with the nuclear reaction:

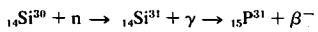

$$_{14}Si^{30} + n \rightarrow {}_{14}Si^{31} + \gamma \rightarrow {}_{15}P^{31} + \beta^-$$

whereby a uniform n-doped semiconductor layer is achieved.

In another embodiment of the invention, an epitaxially deposited semiconductor layer, for example, composed of silicon or an $A_{III}B_V$ compound on a suitable substrate, such as a silicon base, and $A_{III}B_V$ compound base, a sapphire base, a spinel base, etc. is subjected to controlled bombardment by neutrons, preferably thermal neutrons, to produce a uniformly doped semiconductor layer.

Figure 1:
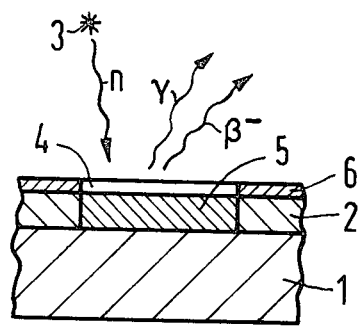
FIG. 1 is a partial elevated cross-sectional view, schematically illustrating a semiconductor layer on a substrate being doped in accordance with the principles of the invention.

Referring now to the drawings, FIG. 1 is a partial view of a semiconductor layer 2 on a substrate 1 undergoing neutron bombardment from a suitable neutron source 3. The neutron source may comprise a nuclear reactor, for example, a core reactor of the light-water moderated type or the graphite moderated type known in the art. The neutron source 3 may be controlled to emit neutrons having an energy level in the range of about 0.025 to 0.3 eV. The neutrons used for bombardment are preferably thermal neutrons. The emitted neutrons penetrate into the semiconductor layer 2 to react with the atoms therein. In instances where the layer 2 is composed of silicon, the neutrons interact with the $_{14}Si^{30}$ isotope within natural silicon and convert these atoms into the $_{14}Si^{31}$ isotope while producing $\gamma$-radiation. The $_{14}Si^{31}$ isotope is unstable and decays into $_{15}P^{31}$ by emitting $\beta^-$particles. In this manner, an extremely uniform doping of, for example, silicon layer 2 with phosphorus is achieved.

In certain embodiments of the invention, a masking layer 6 which contains one or more windows 4 therein, may be provided on the semiconductor layer 2 prior to neutron bombardment so as to provide neutron access to select surface areas of the layer 2. The masking layer 6 may be formed of a cadmium foil or a gadolinium lacquer having windows formed therein by conventional photo-lacquer etching techniques. By practicing this embodiment of the invention, one may uniformly dope select areas, such as area 5, of a semiconductor layer 2 beneath a window 4.

In the practice of the invention the substrate 1 may be composed of suitably pure sapphire or spinel material. With substrate materials of this type, neutrons interact with the atoms thereof to provide isotopes which are either non-radioactive or which decay with a very short half-life into inactive end products. Typical reactions within such substrates are, for example:

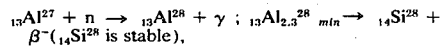

or

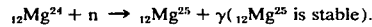

The substrate 1 may also be composed of silicon which may be doped, among other substances, with antimony and/or arsenic. The arsenic and/or antimony dopant atoms are converted by neutrons from a source 3 into radioactive isotopes which have a half-life in the order of magnitude of about 1 to 60 days, respectively. The substrate 1 may also be composed of silicon doped with $B^{11}$ or doped with boron having an enriched amount of $B^{11}$ therein.

The invention is also useful for doping a semiconductor layer composed of an $A_{III}B_V$ compound. For example, when a layer of gallium arsenide (GaAs) or gallium phosphide (GaP) is bombarded with neutrons, initially unstable radio nuclides are formed which decay into stable dopant elements as set forth in the Table below:

As a detailed example of the practice of the invention, a GaAs rod having a diameter of 2 cm and a length of 6 cm was sealed into a $SiO_2$-ampule or in an aluminum bombardment capsule (sealed by welding) and placed in the Karlsruhe-FR 2 experimental reactor at a select position therein so as to subject this specimen to a neutron flux density of $\Phi = 5 \times 10^{13} n \cdot cm^3 \cdot s^{-1}$ for 31 hr. (preferably a flux standard is incorporated into the capsule so as to enable the precise determination of the neutron flux density). After termination of the neutron bombardment, the rod, which weighed 100 g had the following radioactivity (Ci means Curie):

$5 \times 1.97 \times 48.2 \times 1.0 = 473$ Ci $Ga^{70}$ (half-life, $T_{1/2}$ = 20 min.)

$5 \times 3.73 \times 48.2 \times 0.7824 = 704$ Ci $Ga^{72}$ ($T_{1/2}$ = 14.1 hr.)

$5 \times 11.75 \text{ a } 51.8 \times 0.5525 - 1684$ Ci $As^{76}$ ($T_{1/2}$ = 26.7 hr.)

In order for the product of the foregoing nuclear reaction having the longest life to decay (i.e. $As^{76}$), it is advisable for such a specimen to remain $4 \times 267$ hr. = 1068 hr − 45 days in the decay position within the reactor station.

In order to eliminate crystal dislocations, lattice defects and other damage caused by neutron bombardment, the bombarded semiconductor layer must be annealed at temperatures in the range of about 600° to 700°C for at least one hour. However, this annealing step may be omitted if desired, particularly if the doped

TABLE I

| Semiconductor Layer | Radio Nuclide Forming Reaction | Radio Nuclide Half-Life | Type of Decay | Doping Element | Proportion of Doping (%) | |
|---|---|---|---|---|---|---|
| GaAs | $Ga^{69}$ (n, γ) $Ga^{70}$ | 21 min. | $\beta^-$ | $Ge^{70}$ | 11 | 31 |
|  | $Ga^{71}$ (n, γ) $Ga^{72}$ | 14.1 h | $\beta^-$ | $Ge^{72}$ | 20 |  |
|  | $As^{75}$ (n, γ) $As^{76}$ | 26.7 h | $\beta^-$ | $Se^{76}$ | 69 |  |
| GaP | $Ga^{69}$ (n, γ) $Ga^{70}$ | 21 min. | $\beta^-$ | $Ge^{70}$ | 32 | 93 |
|  | $Ga^{71}$ (n, γ) $Ga^{72}$ | 14.1 h | $\beta^-$ | $Ge^{72}$ | 61 |  |
|  | $P^{31}$ (n, γ) $P^{32}$ | 14.2 d | $\beta^-$ | $S^{32}$ | 7 |  |

Figure 2:
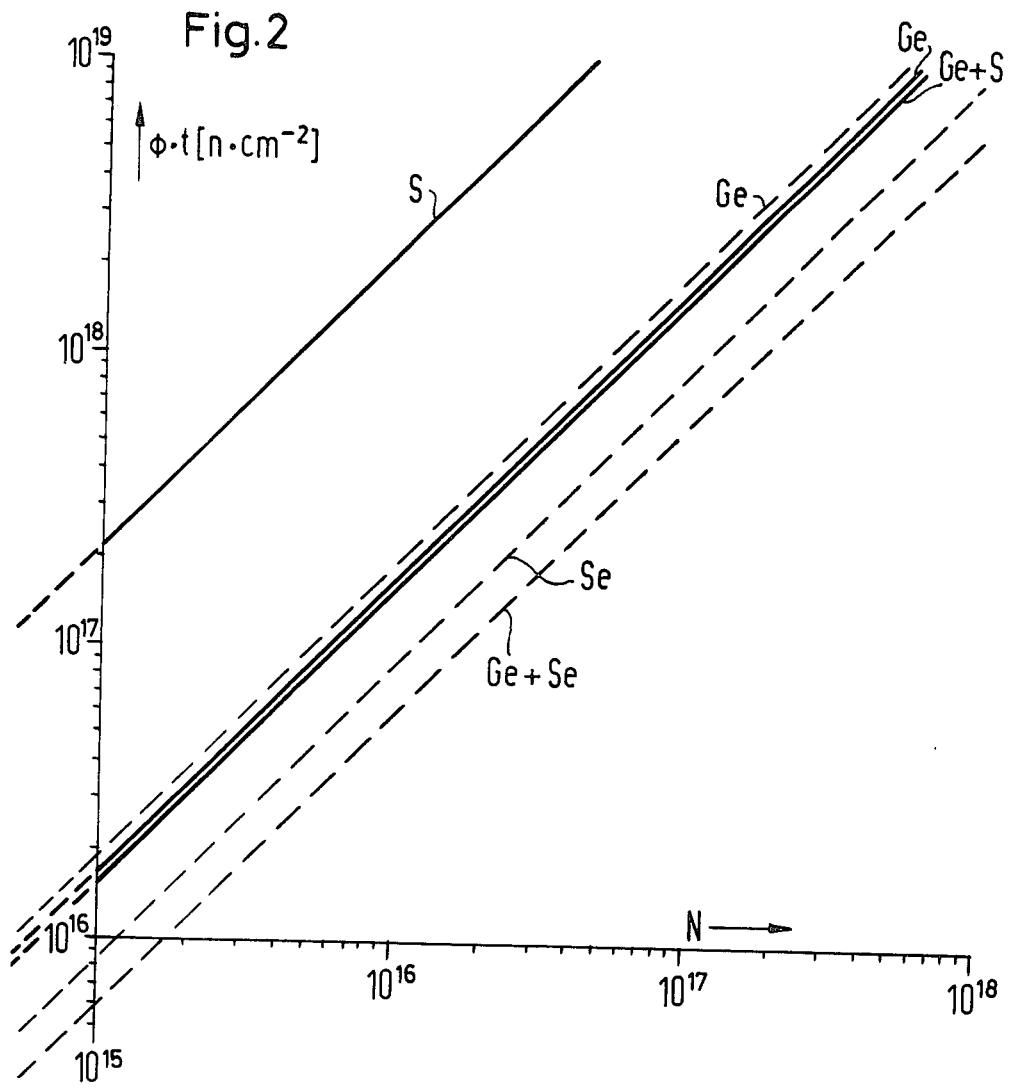
FIG. 2 is a graphical illustration showing the relation between an applied neutron flux and dopant atoms formed in a variety of semiconductor materials.

The relation between an applied neutron fluence, which is equal to neutron flux density $\Phi$, (i.e. neutrons per square centimeter per second) times the bombardment time in seconds and the number of formed doping atoms, N, per cubic centimeter is illustrated at FIG. 2 for the bombardment of a layer composed of GaAs (dotted line) and for a layer composed of GaP (solid line) by thermal neutrons.

As an exemplary embodiment, it is desired to produce a GaAs layer having an n-type conductivity and a dopant concentration of $1 \times 10^{18}$ atoms/cm$^3$. From FIG. 2, it may be determined that in order to achieve a dopant concentration of $1 \times 10^{18}$ atoms of Ge and Se within such a layer (i.e., n-type doping) a neutron fluence of $5.6 \times 10^{18}$ is required. A Karlsruhe-FR 2 experimental nuclear reactor produces a thermal neutron flux of $5 \times 10^{13}$ neutrons per square centimeter per second so that by a simple calculation as set forth below, the proper bombardment time period is readily determined:

$$\frac{5.6 \times 10^{18} \cdot n \cdot cm^{-2}}{5 \times 10^{13} \cdot n \cdot cm^{-2} s^{-1}} = 1.12 \times 10^5 s = 31.1 h.$$

semiconductor layer is then processed into various components and high-temperature conditions are involved in such further processing. After annealing of the bombarded specimens, the charge carrier concentrations and other electrical parameters are readily determined.

Neutron bombardment of $A_{III}B_V$ semiconductor materials containing Al, Ga, N, P As and/or Sb yields uniform dopant concentrations throughout the entire layer of such materials. In instances where B and or In compounds or mixed crystals form the semiconductor layer being doped, a high neutron absorption by such elements can be expected and will result in dopant concentration profiles which radially decrease from the layer surface to the interior thereof. Such decreasing dopant concentration profiles are of specific utility for certain semiconductor components. Further, in instances where B is the dopant within a silicon base, the ratio of $B^{11}$ to $B^{10}$ can be altered in favor of $B^{11}$ in order to decrease neutron absorption by the $B^{10}$ atoms.

It is thought that the invention and its advantages will be understood from the foregoing description and it is apparent that various changes may be made in the process, form, construction and arrangements of parts without departing from the spirit or scope of the invention or sacrificing any material advantages thereof, the forms hereinbefore described and illustrated in the drawing being merely preferred embodiments.

We claim as our invention:

1. A method of doping a semiconductor layer arranged on a substrate with a dopant substance comprising:
subjecting said semiconductor layer to controlled bombardment by neutrons so that atoms of said semiconductor layer are converted by a nuclear reaction into dopant substance atoms.

2. A method as defined in claim 1 wherein said semiconductor layer is composed of silicon and said dopant substance is composed of phosphorus so that the nuclear reaction:

$$_{14}Si^{30} + n \rightarrow {}_{14}Si^{31} + \gamma \rightarrow {}_{15}P^{31} + \beta^-$$

takes place.

3. A method as defined in claim 1 wherein said semiconductor layer is composed of an $A_{III}B_V$ compound and a nuclear reaction selected from the group consisting of:

$$_{31}Ga^{69} + n \rightarrow {}_{31}Ga^{70} \rightarrow {}_{32}Ge^{70} \beta^-;$$

$$_{31}Ga^{71} + n \rightarrow {}_{31}Ga^{72} \rightarrow {}_{32}Ge^{72} + \beta^-;$$

$$_{33}As^{75} + n \rightarrow {}_{33}As^{76} \rightarrow {}_{34}Se^{76} + \beta^-$$

takes place.

4. A method as defined in claim 1 wherein said semiconductor layer is composed of gallium phosphide and the nuclear reactions:

$$Ga^{69} + n \rightarrow Ga^{70} \rightarrow Ge^{70} + \beta^-;$$

$$Ga^{71} + n \rightarrow Ga^{72} \rightarrow Ge^{72} + \beta^-;$$

and $$P^{31} + n \rightarrow P^{32} \rightarrow S^{32} + \beta^-$$

take place.

5. A method as defined in claim 1 wherein said semiconductor layer is composed of Ge and said dopant substance is composed of As so that the nuclear reaction:

$$_{32}Ge^{74} + n - {}_{32}Ge^{75} - {}_{33}As^{75} + \beta^-$$

takes place.

6. A method as defined in claim 1 wherein said neutrons are thermal neutrons.

7. A method as defined in claim 6 wherein said thermal neutrons have an energy in the range of about 0.025 to 0.3 eV.

8. A method as defined in claim 1 wherein said semiconductor layer is epitaxially deposited on a substrate.

9. A method as defined in claim 8 wherein said substrate is a silicon base.

10. A method as defined in claim 9 wherein said silicon base is composed of silicon doped with a material selected from the group consisting of Sb, As P, B and mixtures thereof.

11. A method as defined in claim 9 wherein said silicon base is composed of silicon doped with $B^{11}$.

12. A method as defined in claim 8 wherein said substrate is a sapphire ($Al_2O_3$) base.

13. A method as defined in claim 8 wherein said substrate is a spinel ($MgAl_2O_4$) base.

14. A method as defined in claim 1 wherein a masking layer having at least one window therein is applied onto a free surface of said semiconductor layer prior to subjecting such layer to controlled bombardment by neutrons so that localized doping of the surface area of said semiconductor layer below said window takes place.

15. A method as defined in claim 14 wherein said masking layer is a cadmium foil.

16. A method as defined in claim 14 wherein said masking layer is a gadolinium lacquer layer.

* * * * *